US005214568A

United States Patent [19]

Heng

[11] Patent Number: 5,214,568

[45] Date of Patent: May 25, 1993

[54] TRANSMISSION SYSTEM

[76] Inventor: Fook K. Heng, Lot 10, Jalan Jaya 5, Taman Jaya, Bandar Tun Razak, Cheras, 56000, Kuala Lumpur, Malaysia

[21] Appl. No.: 562,864

[22] Filed: Aug. 6, 1990

[30] Foreign Application Priority Data

Aug. 7, 1989 [MY] Malaysia ............................ 8901067

[51] Int. Cl.$^{5}$ ........................ H01J 29/02; H05K 1/18

[52] U.S. Cl. .................................. 361/395; 361/422; 439/76; 455/128

[58] Field of Search ............... 361/380, 392, 394, 395, 361/399, 413, 422, 424, 406, 428, 391; 455/124, 128, 129; 343/702; 439/76, 502, 257; 174/35 R

[56] References Cited

U.S. PATENT DOCUMENTS 3,848,088 11/1974 Bentz .................................. 178/7.9
4,217,624 8/1980 Tuck .................................. 361/394
4,250,498 2/1981 Walter ................................ 340/556
4,528,616 7/1985 Koppensteiner .................... 361/399
4,864,636 9/1989 Brunius ............................. 455/118

*Primary Examiner*—Gerald P. Tolin
*Attorney, Agent, or Firm*—Fleit, Jacobson, Cohn, Price, Holman & Stern

[57] ABSTRACT

A transmission system for transmission of audio voltage signals has a first transmission portion which includes a cable (16) coupled to a first face of a substantially flat cover member (22). The cable (16) and cover member (22) are integrally coupled to form one entity. Recessed from a surface of a second face of the cover member are socket contacts (24, 26) which receive audio signals from the cable (16). A second transmission portion includes a printed circuit board (32) fixedly secured within an insulating casing (40) through an access opening. The printed circuit board has a transmission circuit coupled to an antenna (38). Connection of the first and second transmission portions is facilitated by connection plugs (34, 36) of the second transmission portion making contact with the socket contacts (24, 26) of the first transmission portion.

7 Claims, 2 Drawing Sheets

TRANSMISSION SYSTEM

BACKGROUND OF THE INVENTION

This invention relates to a system for transmission of signals, and more particularly for transmission of audio voltage signals.

Audio voltage signals produced by audio or audio visual devices are transmitted by various methods. In certain devices like radio player and television set, there are provided with external audio receptacles or jacks to which a length of electric cable and earphones are electrically connected. Audio voltage signals are then transmitted thereof and heard by discrete listeners without causing noise disturbances to the surrounding.

In order to provide such a transmission facility, it is known that audio output voltage of said electrical audio devices operating with AC mains have to be stepped down by means of audio transformers before the audio receptacles or jacks are electrically connected externally.

In another prior art, audio output voltages are isolated by installation of coils between the AC mains and integrated circuits of said devices.

The above prior arts have been somewhat unreliable due to possible electrical hazards caused by breakdown of said audio transformers. There are also incidences in which a relatively minor component failure may cause other components to be overdriven and burned out thereby causing complete failure and direct electrical leakage to chasis of said devices. Under such circumstances, the audio jacks are extremely dangerous for use.

Due to the above mentioned and related deficiencies, it has been a burden for manufacturers concerned to provide facilities in said devices for transmission of audio signals. Therefore, it is not uncommon that transmission facilities are not found in certain audio or audio visual devices.

However, the necessity for transmission of audio voltage signals remains. Whence transmission facilities are not provided, unscupulous practices take place to install various means of transmission to satisfy the needs of individual users.

These installations are more than often in violation to regulations set by the National Electricity Board and Telecommunication Department.

It is therefore the primary object of the present invention to provide a system for transmission of audio signals produced by audio or audio visual devices free of the above electrical hazards caused either by failure of audio transformers or other electrical components. The proposed transmission system also has an economic advantage because no installation of audio transformers is required.

Another object of the present invention is to provide a transmission system easily to be regulated according to rules set by the appropriate authorities.

It is still another object of the present invention to provide a transmission system wherein all electrical parts and antenna for transmission are properly insulated and non-accessible during operative mood. Keeping said components of the transmission system out of contact with the body of users and other conductive surfaces improves the effect of transmission.

From the foregoing, it is yet another important object of the present invention to provide a transmission system adapted for use on conventional audio or audio visual devices with minimum technical modifications to said devices.

BRIEF SUMMARY OF THE INVENTION

According to the invention, there is provided a transmission system for transmission of audio voltage signals from an audio output of an audio device, comprising:

a first transmission means including a cable and a cover member made of insulating material, a first end of the cable being coupled through a first face of the cover member to socket contacts in the cover member, said contacts being accessible from, but recessed back from the surface of, a second face of said cover member, the other end of said cable being removable connectable to the audio output; and a second transmission means including a printed circuit board including a transmission circuit and being fixedly secured within an insulating casing defining an opening having its shape and dimensions adapted to those of the cover member of said first transmission means, said printed circuit board being provided with connection plugs to connect detachably with the socket contacts of said first transmission means.

BRIEF DESCRIPTION OF THE DRAWINGS

For a better understanding of the present invention, and to show how the same may be carried out into effect, reference will now be made by way of a preferred embodiment as illustrated in the accompanying drawings, in which.

DESCRIPTION OF THE PREFERRED EMBODIMENT

Figure 1:
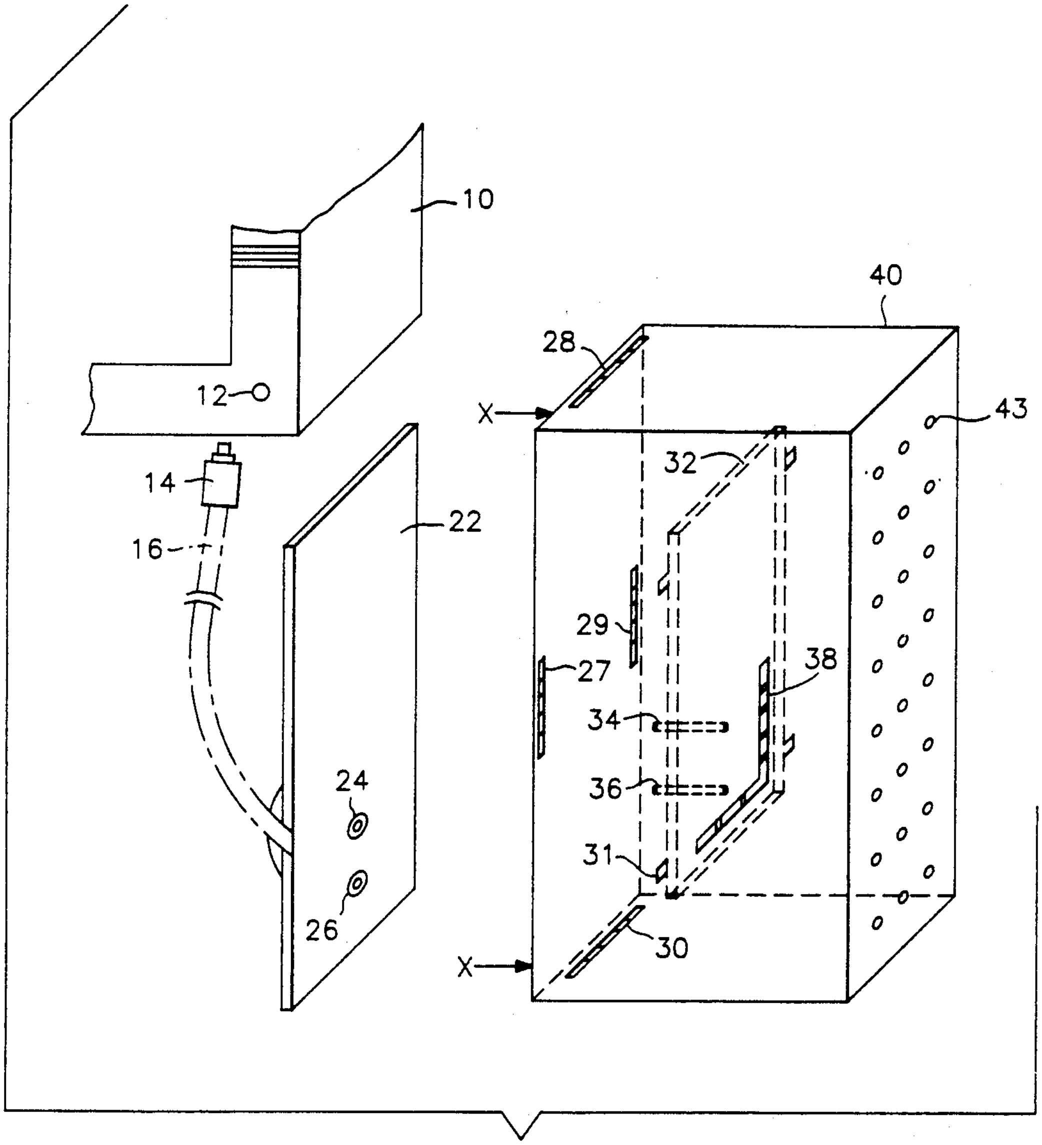
FIG. 1 is a perspective view of a transmission system according to the present invention, illustrating the parts thereof.

A transmission system according to the present invention comprises in combination a first transmission means and second transmission means, which are best illustrated in FIG. 1.

The first transmission means which is to be coupled at one end to an audio output jack 12 of a television set 10, includes a transmission cable 16 and a substantially flat cover member 22 of rectangular shape said transmission cable 16 and cover member 22 are electrically coupled together. Externally, the first transmission means is preferably moulded as an integral structure from electrically insulating material. Within such structure, the electrical parts are embedded and function as explained below.

Figure 2:
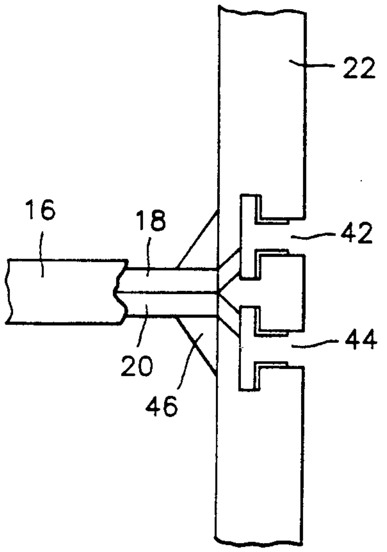
FIG. 2 is a side elevation cross-sectional view of a portion of the cover member of the first transmission means according to FIG. 1.

Cover member 22 has socket contacts 24,26 embedded in its body structure. Connecting said contacts and extending out of a first face of the back of said cover member 22 is a twin-core 18,20 transmission cable 16. The socket contacts 24,26 are recessed back from a second face at said cover member through apertures 42,44 as shown in FIG. 2.

A cable support 46 has been provided externally at the location where said transmission cable 16 leaves the first face of said cover member 22. Such cable support 46 adds mechanical reinforcement to the structure of the first transmission means.

The free ends of said cores of transmission cable 16 are connected to a multi-terminal plug 14. Upon insertion of said multi-terminal plug into the audio output jack 12 in television set 10, audio voltage signals are received in the first transmission means.

The transmission cable 16 may be provided with spiral loops along a portion of its length to facilitate extension and retraction of said cable for convenience in connection.

The audio voltage signals travelling along transmission cable 16 are coupled to socket contacts 24,26 of the cover member 22. Said audio voltage signals are transmitted therefrom to a second transmission means of the transmission system described hereinafter.

The second transmission means includes an insulating casing 40 wherein a printed circuit board 32 is fixedly mounted. The printed circuit board 32 comprises a transmission circuit as shown in FIG. 4., having input terminals to be coupled to said first transmission means through connection of connection plugs 34,36 with contacts 24,26.

Casing 40 of the second transmission means is a five-sided rectangular box-like enclosure with an opening formed by a missing side wall. The side wall directly facing but remote from the opening is perforated with minor holes 43.

Printed circuit board 32 is mounted by mounting means 31 into the casing 40, midway down said opening with the plane of said circuit board parallel to the perforated side wall. Along the inner surface of the bounding wall of said opening of casing 40, there are provided with pairs of oppositely facing resilient fastening lugs 27,28,29,30.

Figure 3:
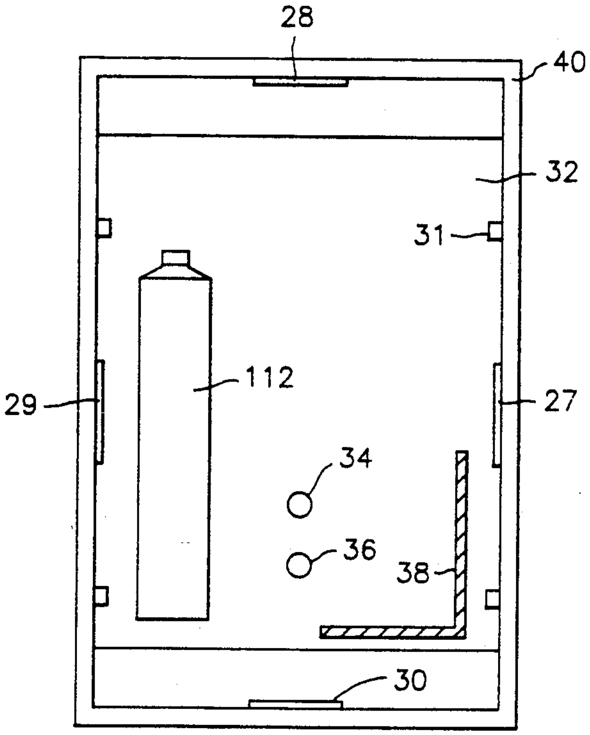
FIG. 3 is a plan view of the second transmission means in X-direction of FIG. 1.
Figure 4:
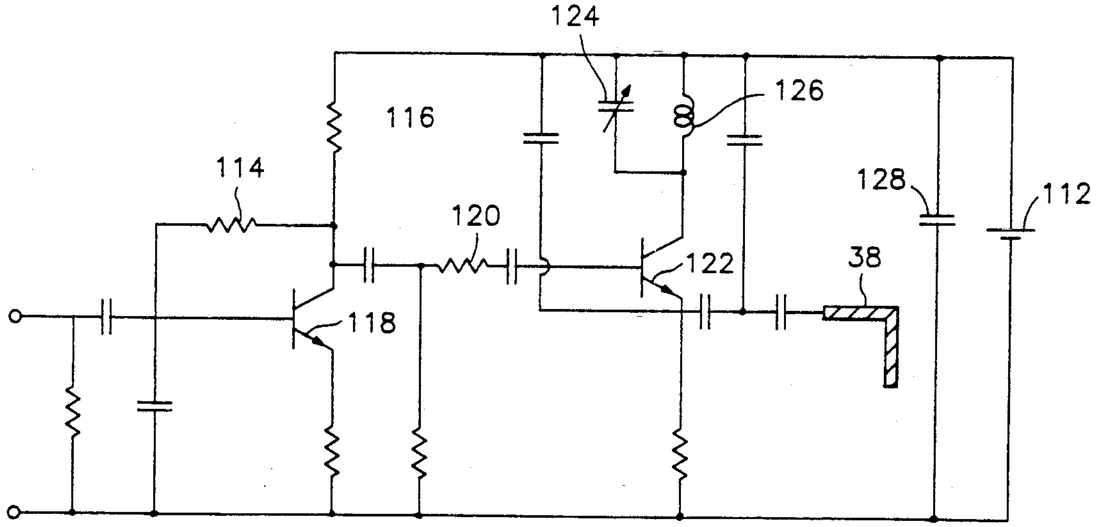
FIG. 4 is a diagram of the transmission circuit of a transmission system according to the present invention.

Printed circuit board 32 includes a transmission circuit powered by a DC battery 112 as shown in FIG. 3 and FIG. 4. The transmission circuit couples to an antenna 38 which is provided on the surface of said printed circuit board.

Protruding clear of said printed circuit board 32 in the direction of said opening of casing 40 are two vertical connection plugs 34, 36. The terminals of said connection plugs do not project out of said casing but are axially beyond the points of fastening plugs 27, 28, 29, 30. Constructionally, said connection plugs 34, 36 are adapted for electrical connection with socket contacts 24, 26 of the first transmission means.

The first transmission means is moved forward in the direction of the second means as shown in FIG. 1. Cover member 22 of the first transmission means having a cross sectional area marginally minor than the opening of casing 40 is urged axially forward into said casing, guided by the bounding walls of said opening. Socket contacts 24, 26 are received by connection plugs 34, 36 of the second transmission means through apertures 42, 44.

Edges of the cover member 22 of the first transmission means undergoes some resilient deformations before being snap-fitted with coopertable fastening plugs 27, 28, 29, 30 of casing 40. In this manner, components enclosed in casing 40 are fully concealed and become non-accessible during connection of the first and second transmission means.

The protrusion lengths of connection plugs 34, 36 have been pre-determined in order that just before connection of the first and second transmission means is achieved, the cover member 22 of the first means shuts off the opening of casing 40 of the second means. Similarly, when the first transmission means is detachably removed from the second transmission means for disconnection, said socket contacts 24, 26 break contact with connection plugs 34, 36 first before the cover member 22 leaves the rim of the opening of casing 40.

In FIG. 4, the audio voltage signals to be transmitted is applied as audio signal input to a transmission circuit.

The transmission circuit is powered by a DC battery 112 regulated by capacitor 128. Said circuit incooperates a pre-amplifying circuit comprising a transistor 118 and related components as shown. Said pre-amplifying circuit is connected to the DC control voltage via resistors 114, 116.

The output of said pre-amplifying circuit is coupled via resistor 120 to an oscillating circuit. Said oscillating circuit comprises a second transistor 122 and related components as illustrated in FIG. 4. Operational values of capacitor 124 and induction coil 126 of said oscillating circuit are obtained in order to effect signal output of desired frequency, which is then filtered and applied to an adjourning antenna 38 for transmission to a receiver. Said antenna 38 provided on the surface of printed circuit board 32 in the form of a strip of metal.

The present invention has been described for a transmission system for transmission of audio voltage signals from a television set to a remote radio receiver. It is to be understood that the invention is not limited to this arrangement and forms of apparatus, and that changes may be made therein without departing from the scope and spirit of the invention which is defined in the appended claim.

I claim:

1. A transmission system for transmission of audio voltage signals from an audio output of an audio device, comprising:

a first transmission means including a cable and a cover member made of insulating material, said cable and cover member permantly and integrally coupled to form one body, such that a first end of the cable is electrically coupled through a first face of the cover member to socket contacts in the cover member, said contacts being flush with the first face of the cover member and accessible from, but recessed back from a surface of a second face of said cover member, another end of said cable being removably connectable to the audio output, and a second transmission means including a printed circuit board having a transmission circuit and being fixedly secured within an insulating casing defining an opening having its shape and dimensions adapted to those of the cover member of said first transmission means, said printed circuit board being provided with connection plugs to connect detachably with the socket contacts of said first transmission means such that said connection plugs project clear of said printed circuit board for a pre-determined distance towards the opening of said casing in that just before contact of said connection plugs with the recessed socket contacts takes place, edges of said cover member shut off the opening of said casing.

2. A transmission system according to claim 1 wherein said cover member has a cross sectional area marginally smaller than the opening of said casing, and is resilient to be snap-fitted with co-operable fastening plugs provided on inner side walls of said casing defining the opening with the fastening plugs each having a pre-determined distance from edges of the walls of said casing such that the cover member can be snap-fitted in one direction.

3. A transmission system according to claim 1, wherein said transmission cable and said recessed socket contacts are located within an integral body made of electrically insulating material.

4. A transmission system according to claim 1, wherein said printed circuit board comprises a transmission circuit and an antenna.

5. A transmission system according to claim 4, wherein said antenna is in the form of a strip of metal on the surface of said printed circuit board.

6. A transmission system according to claim 4, wherein said transmission circuit is DC battery operated.

7. A transmission system according to claim 1, wherein a portion of the wall of said casing of the second transmission means is perforated with minor holes.

* * * * *